(12) United States Patent
Park

(10) Patent No.: US 7,012,670 B2
(45) Date of Patent: *Mar. 14, 2006

(54) METHOD AND APPARATUS FOR ADJUSTING A PHOTO-EXPOSURE TIME

(75) Inventor: Chan-Hoon Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/968,291

(22) Filed: Oct. 20, 2004

(65) Prior Publication Data

US 2005/0078285 A1   Apr. 14, 2005

Related U.S. Application Data

(62) Division of application No. 09/826,838, filed on Apr. 6, 2001, now Pat. No. 6,825,912.

(30) Foreign Application Priority Data

Apr. 6, 2000   (KR) ................ 2000-17986

(51) Int. Cl.
G03B 27/52   (2006.01)
G03D 5/00    (2006.01)

(52) U.S. Cl. ........................ 355/27; 396/611
(58) Field of Classification Search ............... 355/27, 355/40, 69–71, 77; 396/611; 430/30, 311; 438/758; 118/56, 58, 69
See application file for complete search history.

(56) References Cited

U.S. PATENT DOCUMENTS

| | | | | |
|---|---|---|---|---|
| 4,308,586 A | * | 12/1981 | Coates | 356/504 |
| 5,409,538 A | * | 4/1995 | Nakayama et al. | 118/688 |
| 5,777,744 A | * | 7/1998 | Yoshii et al. | 356/603 |
| 5,965,309 A | | 10/1999 | Ausschnitt et al. | 430/30 |
| 6,051,349 A | | 4/2000 | Yoshioka et al. | 430/30 |
| 6,221,787 B1 | * | 4/2001 | Ogata | 438/758 |
| 6,825,912 B1 | * | 11/2004 | Park | 355/27 |

* cited by examiner

*Primary Examiner*—Henry Hung Nguyen
(74) *Attorney, Agent, or Firm*—Volentine Francos & Whitt, PLLC

(57) ABSTRACT

A system is provided for adjusting a photo-exposure time of a manufacturing apparatus for semiconductor devices. The system for adjusting the photo-exposure time includes a photo-exposure unit whose photo-exposure time is adjustable according to one or more adjustment signals, a pre-exposure step influence prediction unit that obtains pre-exposure step processing information and extracts parameters that may influence a resulting pattern during photo-exposure, and provides this information as feed forward data, an inspection unit that checks processed steps during a certain period after photo-exposure and provides an inspection value as a feed back data, and a central processing unit that receives the feed forward and feedback data and, by means of a predetermined calculation method, generates the one or more adjustment signals, which are used to adjust the photo-exposure time.

20 Claims, 2 Drawing Sheets

METHOD AND APPARATUS FOR ADJUSTING A PHOTO-EXPOSURE TIME

This application relies for priority upon Korean Patent Application No. 2000-17986, filed on Apr. 6, 2000, the contents of which are herein incorporated by reference in their entirety. This application is a divisional application of U.S. patent application Ser. No. 09/826,838, filed on Apr. 6, 2001, now U.S. Pat. No. 6,825,912.

BACKGROUND OF THE INVENTION

This invention relates to a photolithography system and process for manufacturing a semiconductor device. More particularly, this invention relates to a system for adjusting a photo-exposure time suitable for variable processing conditions in accordance with prior and following steps.

The greater a semiconductor device is integrated, the more line widths on the device must be narrowed. Furthermore, as the line width is reduced, more accurate alignment is required for patterns of stacked layers formed through a manufacturing process for the semiconductor device. Of all of the various pieces of equipment required for manufacturing semiconductor devices, a photo-exposure apparatus is the most important for determining the alignment accuracy for the stacked layers. In other words, in modern semiconductor manufacturing, a photo-exposure apparatus must have improved capacities for high resolution and fine alignment so as to be capable of manufacturing highly-integrated semiconductor devices.

Various techniques have been used for highly efficient photo-exposure apparatuses. For example, in order to enhance the alignment accuracy in semiconductor device manufacturing technology and to uniformly obtain a fine pattern in an accurate position, conventional G-Line light sources, with a wavelength of 436 nm, are gradually being replaced by I-Line light sources, with a wavelength of 365 nm, or deep ultra violet light sources, with a wavelength of 248 nm. Furthermore, a scanner-type source is dominantly being used rather than a stepper-type source.

There are several factors, such as a kind of lens system used or the light source used that influence the accuracy of a photo-exposure apparatus. In addition, an exposure time adjusting method, the kind and thickness of a photoresist material used, the baking conditions, the developing conditions, etc. may also effect the resultant quality of a photo-exposure work. In particular, a photo-exposure time is a very important parameter to finalize a line width and a uniformity of the pattern geometry. This is because photo-exposure time has an effect at the amount of a photochemical reaction of photoresist at an edge of a pattern image formed on a photoresist film.

Accordingly, although a line width of a pattern is primarily determined by the line width of a photo-exposure mask and a geometric optical configuration of a photo-exposure apparatus, a line width of a photoresist pattern may be also adjusted by controlling the photo-exposure time within a small range.

When controlling a photo-exposure time, it is necessary to first evaluate the size and quality of a photoresist pattern obtained from a previous photo-exposure time. Then, a photo-exposure time can be re-established by a kind of processing feedback according to this evaluation. In other words, an evaluation of a post-exposure step is fed back to a pre-exposure step, so that the pre-exposure step processing condition can be adjusted.

An example of the above technology is disclosed in U.S. Pat. No. 5,965,309. In this patent, a size and a shape of a resulting pattern obtained from a conventional patterning process using a photolithography and an etching are first evaluated. The evaluated result is then progressed, and a processing condition is re-established by means of a predetermined method to influence the patterning. In particular, a method is disclosed that is effective on a final pattern by adjusting a focus and an exposure rate in a photo-exposure process, in addition to the method of adjusting a condition in an etching process.

Although the above patent deals widely with techniques for conditioning photo-exposure and etching steps by adjusting patterning conditions through feedback, it does not clearly consider that a photo-exposure rate would be influenced by adjusting a photo-exposure time.

Meanwhile, a photoresist pattern obtained as a result of a photo-exposure work may be evaluated by an after-development inspection (ADI). Of course, the photoresist pattern is affected not only by various processing conditions directly related to a photo-exposure but also by a result of a pre-exposure step.

For example, if a film stacked before a photo-exposure process is made of a material having a characteristic of reflecting light well or preventing reflection, a photoresist pattern on the film is influenced by the preformed film. Certain parts of a photoresist pattern formed by a photo-exposure may be influenced by the topological pattern of a substrate surface, e.g., an uneven step coverage, formed before a photo-exposure process, or by a relative pattern position obtained after a photo-exposure process.

However, a current system for adjusting photo-exposure time cannot systematically apply a status of a result pattern or a pre-exposure step into the photo-exposure process. In addition, it has been problematic that a photoresist pattern position and a line width obtained after a photo-exposure process are variable based on the state of the power applied to a substrate.

Furthermore, in almost any manufacturing system it is necessary to periodically carry out data collection and evaluation in order use parameters obtained by a process evaluation result for the modification of a processing condition. However, it is not easy to maintain suitable processing condition in many cases while the data collection and evaluation are being carried out.

SUMMARY OF THE INVENTION

An object of the invention is to resolve the above problems. In other words, it is an object of the present invention to provide a system for adjusting a photo-exposure time by using a result of a photo-exposure process.

Another object is to provide a system for adjusting a photo-exposure time capable of enhancing a uniformity of a photoresist pattern by reflecting a feedback of factors to be compensated obtained from a post-exposure evaluation of the photo-exposure result and a feed forward of factors to be cured, obtained before a photo-exposure process.

In order to obtain the above objects, a system for adjusting a photo-exposure time in a semiconductor manufacturing apparatus, the system comprises a photo-exposure unit for adjusting a photo-exposure time of a photo-exposure step performed on a semiconductor device in the semiconductor manufacturing apparatus, in accordance with one or more adjustment signals; a pre-exposure step influence prediction unit for obtaining information about a semiconductor device in the manufacturing apparatus during a pre-exposure processing, prior to the device being subjected to the photo-exposure step, the information including a value of a factor that will influence a line width of a line formed on the semiconductor device in the photo-exposure step, and providing that information as feed forward data; an inspection unit for generating an inspection value by measuring an aspect of the semiconductor device after it has been subjected to the photo-exposure step, and providing the inspection value as feed back data; and a central processing unit for receiving the feed forward data and the feed back data, and generating the one or more adjustment signals based on the feed forward data and the feed back data.

The feed forward data is preferably obtained by quantifying the obtained information. One or more adjustment signals are preferably transmitted to the photo-exposure unit by the central processing unit in a real time.

The one or more adjustment signals are preferably generated through the use of a calculation formula, and the calculation formula preferably weights the feed forward and feed back data.

The central processing unit preferably comprises a database containing information obtained from the photo-exposure unit, the pre-exposure step influence prediction unit, and the inspection unit.

The feed forward data preferably pertains to the thickness of a film formed in processing of the pre-exposure step. The film is preferably a reflection barrier layer formed in the pre-exposure step.

The photo-exposure unit can be made to adjust a photo-exposure time based on the adjustment signals received from the central processing unit.

The pre-exposure step influence prediction unit obtains pre-exposure step processing information for a semiconductor substrate to be processed in the photo-exposure unit. Based on this information, the pre-exposure step influence prediction unit extracts the values of parameters to affect the width of a line formed in the photo-exposure unit. Furthermore, if the extracted values are difficult to be processed, the values may be quantified by a predetermined logical method. The pre-exposure step influence prediction unit stores the extracted or quantified values as feed forward data to be provided to the central processing unit.

The inspection unit checks and stores a pre-exposure step result from the photo-exposure unit. In other words, it checks a line width value for a semiconductor substrate formed in the photo-exposure unit. Instead of the pre-exposure step result value, the inspection unit may store a differential value obtained by comparing the pre-exposure step result value with a target value formed for a pre-exposure step processing. The stored values are then used as feed back data. In case a value to be compared is stored as a feed back data, a target value for a pre-exposure step should be input to the inspection unit.

The central processing unit receives data from the pre-exposure step influence prediction unit and the inspection unit. These data are applied to a predetermined programmed calculation method and are used to generate the adjustment signals. In many cases, the adjustment signals include a differential value to be corrected considering a pre-step photo-exposure time in the photo-exposure unit. Alternatively, an adjustment signal could be an optimal photo-exposure time itself.

The adjustment signal is transferred to the photo-exposure unit as intact or converted signals adaptable to the photo-exposure unit. It is desirable to transmit the signals in a real time before a semiconductor substrate is processed, to prevent some substrates from being exposed during an inappropriate photo-exposure time.

It is preferable to apply a predetermined calculation method to the central processing unit in the present invention considering a processing status. For instance, the data to be calculated in the predetermined method is stored in the inspection unit or the pre-step influence prediction unit. Among the stored data, the most recent data result may have a weighted value. In this case, the weighted value may be inputted together with the data to be calculated.

The processing steps in this invention are performed on substrate lots because the substrates in the same lot are treated by the same conditions. The three most recent lots of the processed substrates in the photo-exposure unit may be inspected so as to obtain a pre-step result. A photo-exposure time value for correction by a predetermined calculation method corresponds to a differential value for line width obtained from analyzing differential values for line widths from the previous three lots. Furthermore, a time value for correction corresponding to feed forward data may be also considered for a calculation of the time value for correction.

The photo-exposure result of multiple pre-exposure steps, i.e., accumulated data of line width values after development may be used for evaluating the influence of pre-exposure steps. For example, line width values are arranged in the ADI step for each prior processed lot. In the pre-exposure steps of each prior process, factors influencing a photo-exposure process are determined and the values are quantified.

The relation between line width values and quantified factor values may be arranged by a graph or a function. Instead of the line width values, the differential value from a line width value and a target value of the line width may be used for obtaining the relationship. When a graph or a function related to a line width from the factor values is obtained, the relationship is reflected in the predetermined calculation method.

In this invention, a reflectivity is determined by the thickness and quality of substrate surface formed in the most recent pre-exposure step process. The reflectivity may be illustrated as a factor value capable to be quantified or feed forward data.

BRIEF DESCRIPTION OF THE DRAWING

This invention may be more fully understood from the following drawings.

DETAILED DESCRIPTION OF THE PREFERRED EMBODIMENTS

Figure 1:
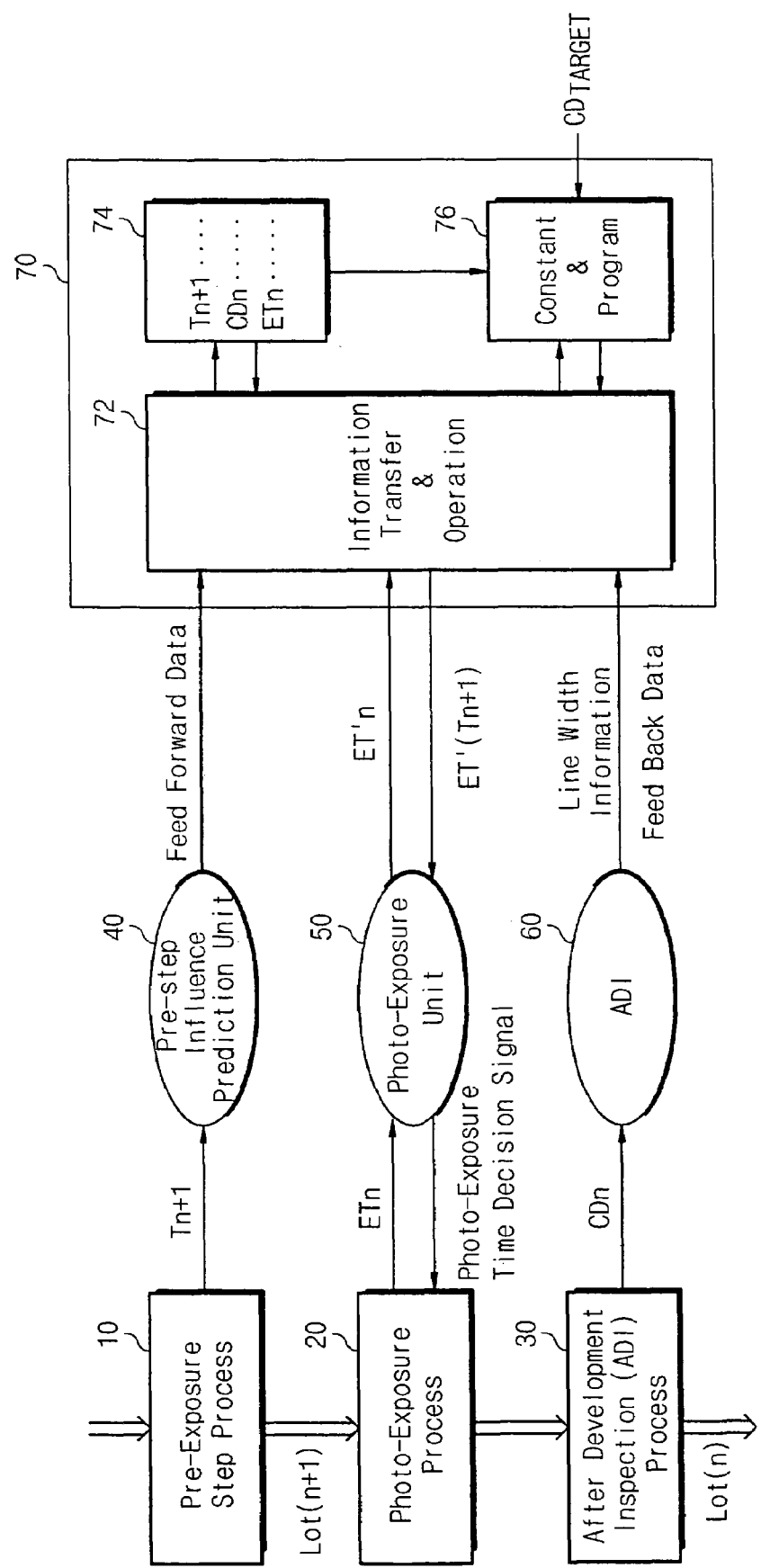
FIG. 1 is a schematic showing the flow of processing and information of a preferred embodiment of this invention.

FIG. 1 is a schematic showing the flow of processing and information of a preferred embodiment of this invention. In FIG. 1, double-line arrows indicate the flow of a wafer treatment and single-line arrows indicate an information processing flow.

During processing, a wafer is first provided to a pre-exposure step process. In the pre-exposure step process 10, a silicon-nitride film is preferably deposited uniformly on the surface of a wafer. Next, the wafer is provided to a photo-exposure process 20. In the photo-exposure process 20, a photoresist is formed over a whole surface of the wafer, and then baking, exposing, and developing are sequentially performed. After the development portion of the photo-exposure process, the wafer then progresses to the after-development inspection (ADI) process 30, which inspects and measures a line width of the photoresist pattern formed after the photo-exposure process 20. The wafer is then transferred to the next process using a photoresist mask such as an etching or an ion implantation process.

During the above processing steps, information about a relevant process condition or process result is provided to a pre-exposure step influence prediction unit 40, a photo-exposure unit 50, and an after development inspection (ADI) unit 60. This information is then provided to a central processing unit 70, and is used as needed.

In the silicon-nitride depositing pre-exposure step process 10, the reflectivity and thickness of the silicon-nitride film, etc. act as parameters that influence the photo-exposure process. Therefore, values obtained for these factors are provided to the pre-exposure step influence prediction unit 40.

In the photo-exposure process 20, information regarding the photo-exposure time is provided to the photo-exposure unit 50 together with other conditioning parameters, such as characteristics of the photoresist material and light source, baking temperature and time, development conditions, and so on. It is desirable that a photo-exposure time be classified and managed with the unique number of reticles because photo-exposure time may vary by reticles even in the same step and equipment.

Throughout the whole process, the information from each step may be classified by the reticle order for each wafer. In the alternative, however, an order extracted from the information values corresponding to the lot numbers may be processed and stored as a representative value. In this case, the lot number is a processing unit.

In the ADI step 30, an inspection is conducted to check a line width at a predetermined region on the wafer after a single step, or on a wafer extracted as a sample out of the processing units. The value of the line width measured from the ADI step is stored in the ADI unit 60.

A measured line width value $CD_n$ for an $n^{th}$ step is obtained from the ADI unit 60, and is compared with a line width target value $CD_{TARGET}$ input to the central processing unit 70. From these two values, a differential value $\Delta CD_n$ is determined, according to equation (1).

$$\Delta CD_n = CD_{TARGET} - CD_n, \tag{1}$$

where the abbreviation "CD" stands for "critical dimension."

The differential value $\Delta CD$ is then stored in a corresponding storage location in the central processing unit 70.

In the photo-exposure process 20, a photo-exposure time, which is adjusted by a reticle, is determined to be $ET_n$ for the $n^{th}$ step. In addition, a standard photo-exposure time $ET_{STANDARD}$ is provided to the central processing unit 70, based on the target value $CD_{TARGET}$. From these two values, a differential exposure time $\Delta ET_n$, representing a difference between the standard photo-exposure time and a real photo-exposure time for the $n^{th}$ step, can be determined according to equation (2).

$$\Delta ET_n = ET_{STANDARD} - ET_n \tag{2}$$

A ratio of a variation for a line width to a variation of photo-exposure time is expressed as a constant G. The constant G may be established by averaging the ratio $$\frac{\Delta CD_n}{\Delta ET_n}$$

over a plurality of steps, e.g., as repeated 100 times.

The ratio of $$\frac{\Delta CD_n}{\Delta ET_n}$$

is summarized in equation (3) below when it is averaged over 100 steps. In this way, the constant G may be corrected into an optimal value regarding accumulated data in the central processing unit. Although FIG. 3 uses 100 as the number of steps for averaging, it could be higher or lower as desired.

$$G = \frac{1}{100} \sum_{n=1}^{100} \frac{\Delta CD_n}{\Delta ET_n} \tag{3}$$

Based on the above relationship, it is possible to obtain the value $\Delta ET_n$, i.e., the difference of photo-exposure time, from the constant G and the $\Delta CD_n$, by dividing $\Delta CD_n$ by G. As a result, a desired photo-exposure time value $ET'_n$, can be obtained by such an inverse operation using the values of G and $\Delta CD_n$.

The set photo-exposure time for the $n^{th}$ step is $ET_n$, and the photo-exposure time correction value for the $n^{th}$ step is $\Delta ET_n$. The desired photo-exposure time for the $(n+1)^{th}$ step $ET'_{n+1}$ is then obtained by correcting the $n^{th}$ determined photo-exposure time by the $n^{th}$ time correction value $\Delta ET_n$, according to equation (4) below.

$$ET'_{n+1} = ET_n + \Delta ET_n, \tag{4}$$

keeping in mind that the value $ET_{n+1}$ is determined based on an actual photo-exposure time $ET_n$ obtained from a desired photo-exposure time for the $n^{th}$ step, i.e., $ET'_n$, which is set from a feed back operation with the $n^{th}$ processing result.

The value resulting from equation (4) may be reliable assuming no influence from pre-exposure step process 10 to the $(n+1)^{th}$ step. Therefore, the result from the equation (4) would be adaptable only to a photo-exposure process relatively free from any influence from the pre-exposure step.

In the above equation (4), although the difference value $\Delta ET_n$ is added to $ET_n$, there may also be a variation to this value in accordance with light-sensitive type of photoresist material used, i.e., negative or positive.

Because of this, an evaluating operation to determine an optimum photo-exposure time that uses only feed back-parameters and is not influenced by the pre-exposure step process 10 is not suitable for a complex process that is sensitive to a film formation in the pre-exposure step process 10. Thus, for a manufacturing process associated with factors of the complexity and sensitivity, a desired photo-exposure time $ET'_n$ should be modified with regard to information from the pre-exposure step process 10. In other words, it is required for a photo-exposure time to be recognized as a function of quantified values of factors arising from a pre-exposure step.

An example will now be described showing how to obtain the information regarding the influence from the pre-exposure step process 10 in the case of that there is accumulated data of line width values $CD_n$ for substrates from the ADI process 30 on which numerous pre-exposure steps have preceded.

First, an effective relation is accumulated of the profiles of the silicon-nitride film that acts as a reflection barrier layer. Then, using the accumulated data, a desired photo-exposure time $ET'_n$ is obtained and stored. This desired photo-exposure time $ET'_n$ is required to determine a desired line width for each pre-processed lot. Also, the thickness of the silicon-nitride film, which has been formed in a pre-exposure step process of each prior task, is inspected, as are the line widths obtained from ADI when a desired photo-exposure time is used in the photo-exposure process. The relationship between the thickness of silicon-nitride films and the desired photo-exposure time $ET'_n$ is determined from the result.

It is desirable that other processing parameters are fixed while obtaining this data. However, if there are large amount of the accumulated data, the processing parameters, in the aggregate, are largely stable. Therefore, the relationship may be obtained even when other processing parameters are not monitored, if multiple samples are observed.

The relation may be obtained by the central processing unit 70 a functional formula or data from a graph stored in the and the pre-exposure step influence prediction unit 40. As a result, a corrected desired photo-exposure time $ET'(t_n)$ may be obtained from the functional formula or graph. The desired photo-exposure time corresponds to the thickness of silicon-nitride films on the substrate surface from a pre-exposure step processing of an $n^{th}$ step.

If the accumulated data are not sufficient, or the resulting values are often changed by some factors, other methods may be used. In other words, data is acquired from small number of recently-processed substrates. A photo-exposure time corresponds identically to the thickness of silicon-nitride films of a certain range instead of the thickness of silicon-nitride films obtained successively.

As shown above, considering the pre-exposure step result, the value $ET'_{n+1}$ from equation (4) may be changed to a corrected desired photo-exposure time $ET'(t_{n+1})$ by a feed forward process described in equation (5) below. According to equation (5), the thickness of silicon-nitride film of a pre-exposure step substrate to be processed $t_{n+1}$ is first acquired from the pre-exposure step influence prediction unit 40. An appropriate photo-exposure time $ET(t_{n+1})$ is then acquired corresponding the measured thickness of silicon-nitride film $t_{n+1}$ to an expected photo-exposure time. In this method, feed forward is performed.

Finally, a corrected desired photo-exposure time $ET'(t_{n+1})$ is obtained by adding a corrected time value $\Delta ET_n$ obtained from the result of a prior task in the inspection unit 60 and an appropriate photo-exposure time. The photo-exposure unit 50 transmits a signal (preferably a photo-exposure time decision signal) so as to perform a photo-exposure during the corrected desired photo-exposure time $ET'(t_{n+1})$.

Equation (5) is the calculation method of the above example. The functional relationship between the thickness of current silicon-nitride film $t_n$ and $ET(t_n)$ of equation (5) has been inputted to the central processing unit in advance. Generally the relation between $t_n$ and $ET(t_n)$ is obtained by many data acquired by prior execution. These processes may be operated by real time through the system integrating of each processing step. Among the units, the processing condition, target value, and the inspection result are transferred simultaneously. It is desirable that information flow is programmed in advance for a simultaneous operating.

$$ET'(t_{n+1}) = ET(t_{n+1}) + \Delta ET_n \qquad (5)$$

If the relation between the $ET(t_n)$ and $t_n$ is not clear and a photo-exposure time for the thickness of the silicon-nitride film of substrate is difficult to obtain, a tendency value from a weighted average may be used as shown in equation (6) in accordance with the pre-exposure step result.

$$ET(t_{n+1}) = ET'(t_n) \cdot 0.5 + ET'(t_{n-1}) \cdot 0.3 + ET'(t_{n-2}) \cdot 0.2 \qquad (6)$$

In addition, although this particular weighting scheme is used in the preferred embodiment, different weighting schemes may be used in alternate embodiments. Such weighting schemes may use more or less than three past exposure times, and may employ different weighting factors for these exposure times.

Figure 2:
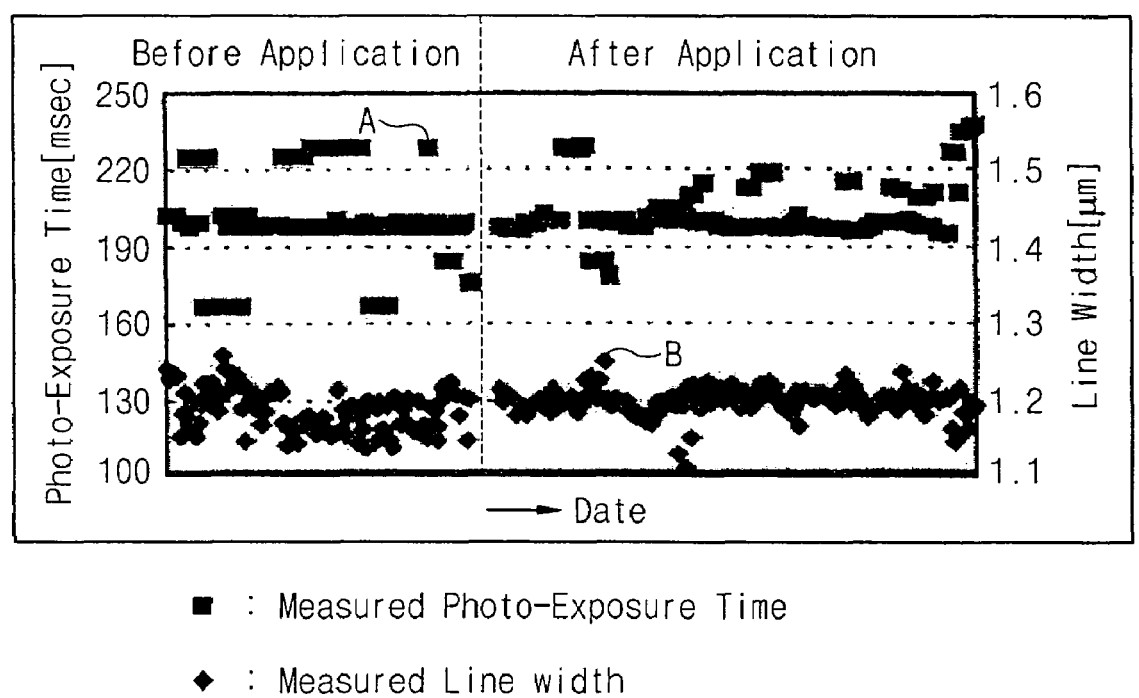
FIG. 2 is a graph of a photo-exposure time and the result of after-development inspection (ADI) of a line width before and after this preferred embodiment invention has been applied.

FIG. 2 is a graph of measured line widths after development and various photo-exposure times. In particular, FIG. 2 shows the processing results before and after applying a system for adjusting a photo-exposure time in accordance with a preferred embodiment of the present invention. Each mark on the graph indicates a single time of photo-exposure processing. On the vertical y-axis, the rectangular marks A on the upper part indicate measured photo-exposure times, and the diamond marks B on the lower part indicate measured line widths from after development inspections. The horizontal x-axis represents the passage of time. As shown in FIG. 2, the distribution profile is improved to about 27% than before, and the uniformity of line width comes near an average value. This can be seen by comparing the root mean square values in each region.

As described above, according to the preferred embodiment of the present invention, the central processing unit 70 calculates and corrects the data at a high speed, and immediately provides the result to the photo-exposure unit 50. Since the photo-exposure can then be processed by the corrected photo-exposure time, it can process according to an appropriate condition. Furthermore, the optimal photo-exposure time may be obtained in advance by considering the pre-exposure step result including a correction of processing condition in a feedback way. As a result of this, a photo-exposure result pattern may be aligned more accurately.

What is claimed is:

1. A method of adjusting a photo-exposure time for a semiconductor manufacturing process, the method comprising:

adjusting a photo-exposure time of a photo-exposure step performed on a semiconductor device in accordance with one or more adjustment signals;

obtaining information about the semiconductor device during a pre-exposure process performed prior to the photo-exposure step, the information including a value of a factor influencing the width of a line formed on the semiconductor device in the photo-exposure step;

providing the information as feed forward data;

generating an inspection value by measuring an aspect of the semiconductor device after it has been subjected to the photo-exposure step, and providing the inspection value as feed back data; and, receiving the feed forward data and the feed back data, and generating the one or more adjustment signals based on the feed forward data and the feed back data.

2. The method of claim 1, wherein the feed forward data is obtained by quantizing the factor.

3. The method of claim 1, wherein the adjustment signals are generated in real time by a central processing unit.

4. The method of claim 1, wherein the adjustment signals are generated according to a formula.

5. The method of claim 4, wherein the formula uses the feed forward and feed back data to generate the adjustment signals.

6. The method of claim 1, wherein the feed forward data relates to the thickness of a film formed in the pre-exposure step.

7. The method of claim 6, wherein the film comprises a reflection barrier layer formed in the pre-exposure step.

8. A method of adjusting a photo-exposure time for a semiconductor manufacturing process, the method comprising:
performing a pre-exposure step process comprising depositing a silicon-nitride film on a surface of a wafer;
acquiring the thickness of the silicon-nitride film and providing the thickness as feed forward data;
performing a photo-exposure process comprising forming a photoresist film over the surface of the wafer and baking, exposing, and developing the wafer;
performing an after-development inspection (ADI) process comprising inspecting and measuring a line width of a photoresist pattern formed by the photo-exposure process and providing the line width as feed back data; and,
adjusting a photo-exposure time for the photo-exposure process based on the feed forward data and the feed back data.

9. The method of claim 8, further comprising:
providing information to a pre-exposure step influence unit, a photo-exposure unit, and an ADI unit; and,
subsequently providing the information to a central processing unit.

10. The method of claim 9, wherein the information provided to the pre-exposure step influence unit comprises a reflectivity and thickness of the silicon-nitride film;
wherein the information provided to the photo-exposure unit comprises the photo-exposure time; and,
wherein the information provided to the ADI unit comprises the line width.

11. The method of claim 8, wherein adjusting the photo-exposure time for the photo-exposure process based on the feed back data comprises:
comparing the line width to a line width target value to determine a critical dimension differential value;
determining a differential exposure time representing a difference between a standard exposure time based on the line width target value and the photo-exposure time; and,
correcting the photo-exposure time by adding the differential exposure time thereto.

12. The method of claim 8, wherein adjusting the photo-exposure time for the photo-exposure process based on the feed back data comprises:

comparing the line width to a line width target value to determine a critical dimension differential value;
determining an average ratio of critical dimension differential value versus differential exposure time over a plurality of steps;
dividing the average ratio by the critical dimension to determine a differential exposure time; and,
correcting the photo-exposure time by adding the differential exposure time thereto.

13. The method of claim 8, wherein adjusting the photo-exposure time for the photo-exposure process based on the feed forward and feed back data comprises:
determining the photo-exposure time according to the acquired thickness of the silicon-nitride film; and,
adding a corrected time value based on the feed back data to the photo-exposure time.

14. An apparatus for adjusting a photo-exposure time in a semiconductor manufacturing process, the apparatus comprising:
a photo-exposure unit for adjusting a photo-exposure time of a photo-exposure process performed on a wafer in accordance with one or more adjustment signals;
a pre-exposure step influence prediction unit for obtaining information about the wafer during a pre-exposure process performed prior to the photo-exposure step, wherein the information includes a value of a factor influencing the width of a line formed on the wafer in the photo-exposure step and the information is provided as feed forward data;
an inspection unit for generating an inspection value by measuring an aspect of the wafer after it has been subjected to the photo-exposure step and providing the inspection value as feed back data; and,
a central processing unit for receiving the feed forward data and the feed back data and generating the one or more adjustment signals based on the feed forward data and the feed back data.

15. The apparatus of claim 14, wherein the feed forward data is obtained by quantizing the factor.

16. The apparatus of claim 14, wherein the adjustment signals are generated in real time by the central processing unit.

17. The apparatus of claim 14, wherein the adjustment signals are generated according to a formula.

18. The apparatus of claim 17, wherein the formula uses the feed forward and feed back data to generate the adjustment signals.

19. The apparatus of claim 14, wherein the feed forward data relates to the thickness of a film formed in the pre-exposure step.

20. The apparatus of claim 19, wherein the film comprises a reflection barrier layer formed in the pre-exposure step.

* * * * *